US009768755B2

(12) United States Patent
Seguritan et al.

(10) Patent No.: US 9,768,755 B2
(45) Date of Patent: Sep. 19, 2017

(54) LOOKUP TABLE ASSISTED PULSE WIDTH MODULATION

(71) Applicant: Hamilton Sundstrand Corporation, Windsor Locks, CT (US)

(72) Inventors: Alex Seguritan, San Diego, CA (US); Ravishankar Piramanayagam, San Diego, CA (US)

(73) Assignee: HAMILTON SUNDSTRAND CORPORATION, Windsor Locks, CT (US)

(*) Notice: Subject to any disclaimer, the term of this patent is extended or adjusted under 35 U.S.C. 154(b) by 0 days.

(21) Appl. No.: 14/200,877

(22) Filed: Mar. 7, 2014

(65) Prior Publication Data

US 2014/0300427 A1    Oct. 9, 2014

Related U.S. Application Data

(60) Provisional application No. 61/810,124, filed on Apr. 9, 2013.

(51) Int. Cl.
*H03F 3/217* (2006.01)
*H03K 3/017* (2006.01)
*H03K 7/08* (2006.01)
*H02M 7/5395* (2006.01)

(52) U.S. Cl.
CPC .......... *H03K 3/017* (2013.01); *H02M 7/5395* (2013.01); *H03F 3/217* (2013.01); *H03K 7/08* (2013.01); *H03C 2200/0045* (2013.01)

(58) Field of Classification Search
CPC ............ H03C 2200/0045; H03F 3/217; H03F 3/2171; H03K 3/017; H03K 5/04–5/07; H03K 7/08

USPC .......... 318/599; 327/31, 172; 332/109, 110; 375/238

See application file for complete search history.

(56) References Cited

U.S. PATENT DOCUMENTS

| 7,012,396 B1* | 3/2006 | Brenden et al. .............. 318/599 |
| 8,675,725 B2* | 3/2014 | Staszewski et al. .......... 375/238 |
| 2012/0032629 A1 | 2/2012 | Peterson |

FOREIGN PATENT DOCUMENTS

EP    0316006 A2    5/1989

OTHER PUBLICATIONS

European Search Report for EP Application No. EP 14163684. Mailed on Oct. 10, 2014, 7 Pages.

* cited by examiner

*Primary Examiner* — Levi Gannon
(74) *Attorney, Agent, or Firm* — Cantor Colburn LLP

(57) ABSTRACT

Embodiments are directed to modulating a pulse width modulation (PWM) signal, by initializing at least one phase index to an initial value, establishing a set of values in a lookup table that correspond to data points for PWM comparator values that correspond to a given number of samples of a single periodic waveform during a predetermined sampling rate that establishes a table resolution, repeatedly executing the following operations at the predetermined sampling rate: determining a value of a command signal frequency, setting a value to a jump factor equal to the quotient of the value of the command signal frequency divided by the table resolution, progressing the value of the phase index by the value of the jump factor, selecting a value of a commutation vector from the lookup table that corresponds to the phase index, and loading the value of the commutation vector into a corresponding PWM comparator.

8 Claims, 4 Drawing Sheets

LOOKUP TABLE ASSISTED PULSE WIDTH MODULATION

CROSS-REFERENCE TO RELATED APPLICATIONS

This application claims the benefit of U.S. Provisional Application No. 61/810,124, filed Apr. 9, 2013, the contents of which are incorporated herein by reference.

BACKGROUND

Variable frequency switching inverters are often desirable for controlling the speed of alternating current (AC) motors of the induction type as well as brushless direct current (DC) motors. Such switching inverters generally provide pulse width modulation (PWM) power to the motor armature.

The simplest way to generate appropriate PWM power is by using the so-called intersection method or intersection technique, wherein PWM comparators in the switching inverter compare a sine wave control signal to a triangle wave carrier signal. When the value of the control signal is greater than the value of the carrier signal, the PWM comparators turn on, creating a PWM signal high state. When the value of the control signal is less than the value of the carrier signal the PWM comparators turn off, creating a PWM signal low state.

Generation of such analogue signals is possible with digital circuitry using appropriate digital-to-analogue converters, but the use of digital-to-analogue converters is not feasible in some applications. Alternatively, it is possible to generate values of the needed analogue control and carrier signals as a function of time using purely digital circuitry, such as by a microcontroller, digital signal processor (DSP), application specific integrated circuit (ASIC) or field programmable gate array (FPGA).

Typical PWM waveform generation implementation requires a carrier signal frequency of 25 kHz or more and the synthesis of such waveforms involves complex trigonometric and floating point arithmetic operations. A high processor clock rate is required to meet computational and interrupt latency times, which increases current demand for the processor in addition to making the processor susceptible for EMI interference. If application cost constraints require a fixed point processor for the PWM waveform implementation, emulation of the required floating point calculation requires more instruction and processing time. This increases application code size and execution times.

BRIEF SUMMARY

Embodiments are directed to modulating a pulse width modulation (PWM) signal by initializing at least one phase index to an initial value, establishing a set of values in a lookup table that correspond to data points for PWM comparator values that correspond to a given number of samples of a single periodic waveform during a predetermined sampling rate that establishes a table resolution, repeatedly executing the following operations at the predetermined sampling rate: determining a value of a command signal frequency, setting a value to a jump factor equal to the quotient of the value of the command signal frequency divided by the table resolution, progressing the value of the phase index by the value of the jump factor, selecting a value of a commutation vector from the lookup table that corresponds to the phase index, and loading the value of the commutation vector into a corresponding PWM comparator.

Additional embodiments are described below.

BRIEF DESCRIPTION OF THE DRAWINGS

The present disclosure is illustrated by way of example and not limited in the accompanying figures in which like reference numerals indicate similar elements.

DETAILED DESCRIPTION

Figure 1:
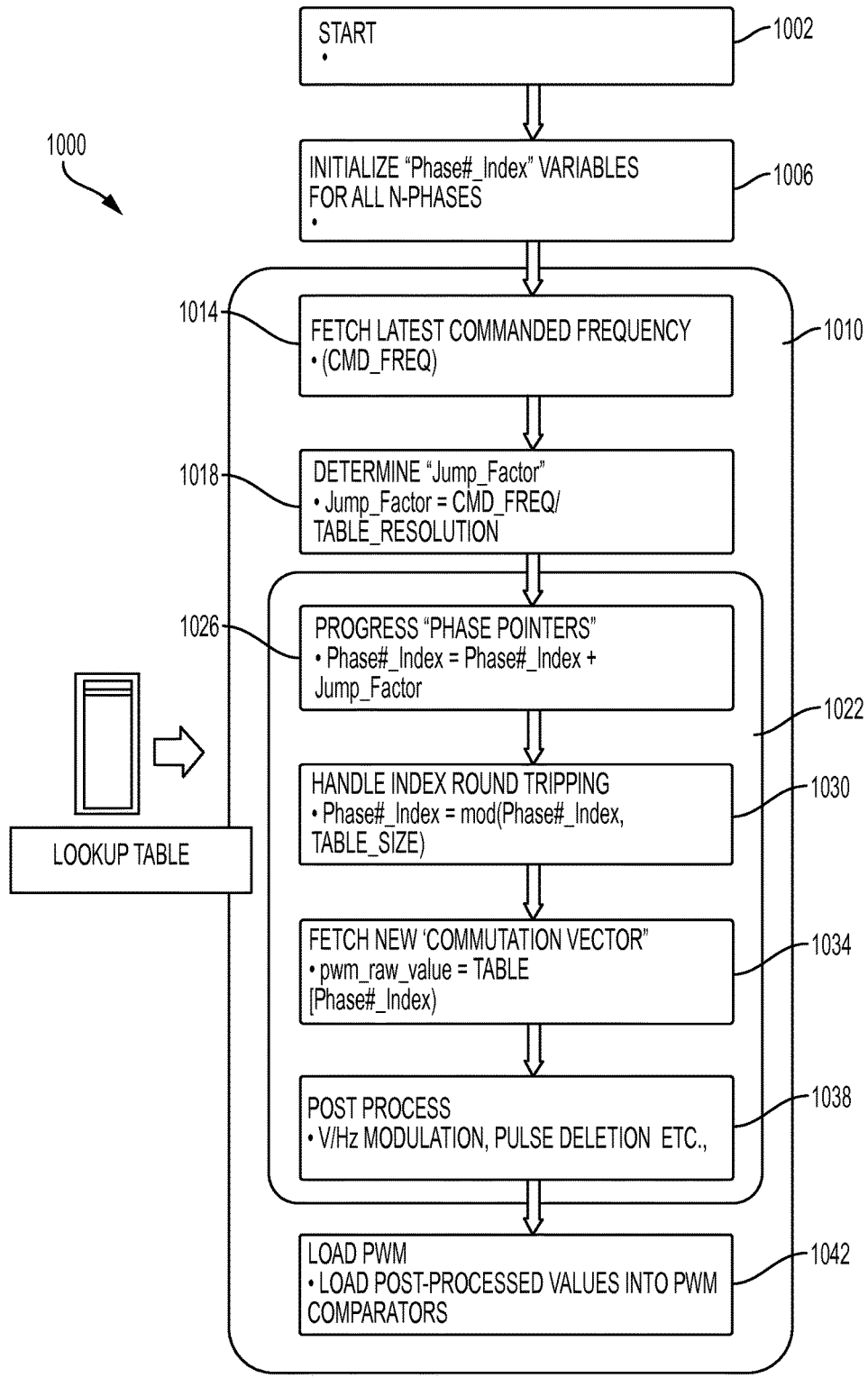
FIG. 1 is a flow chart of a pulse width modulation process according to a first embodiment.

It is noted that various connections are set forth between elements in the following description and in the drawings (the contents of which are included in this disclosure by way of reference). It is noted that these connections, unless specified otherwise, may be direct or indirect and that this specification is not intended to be limiting in this respect. In this respect, a coupling between entities may refer to either a direct or an indirect connection.

Exemplary embodiments of apparatuses, systems, and methods are described for pre-computing waveform characteristics for a single cycle of a periodic waveform and storing data points corresponding to the appropriate PWM comparator values that correspond to a given sampling instance of the waveform in a lookup table. With relatively simple operations, it is possible to derive appropriate PWM comparator values over a wide range of control or command frequency ranges just by storing the data points for a single lowest or base frequency waveform. Such techniques may be used as an alternative to, or in addition to, generating values of a control signal and a carrier signal digitally in real time using trigonometric and floating point operations or emulating floating point operations in the case of fixed point processing.

FIG. 1 is a flow chart of a method or process 1000, the start of which is denoted at block 1002. The process 1000 may be employed for both single and polyphase systems. When used for a polyphase system of N phases, the process 1000 keeps track of the waveform positions of each of the N phases using phase index index variables (PHASE#_INDEX). For instance, if the process 1000 employs a lookup table of such size (TABLE_SIZE) that has 10000 data points, that is, TABLE_SIZE=9999, for a polyphase system of three phases, the process 1000 may initialize or set a first phase index variable (PHASE1_INDEX) to a value of 0000, a second phase index variable (PHASE2_INDEX) to a value of 3333 and a third phase index variable (PHASE3_INDEX) to a value of 6666. The initialization may occur in block 1006.

Following the initialization of block 1006, the process 1000 then begins a repeating routine, denoted in FIG. 1 by block 1010. The repeating routine 1010 may be performed or executed at a desired PWM sampling rate, such as by use of an interrupt software routine (ISR). The ISR may complete the following blocks or operations described below.

The first operation, denoted by block 1014, is to determine a value of a variable corresponding to a desired control or command signal frequency (CMD_FREQ). This value may be at or greater than a value of a base frequency waveform, the data points of which the lookup table stores.

If the command signal frequency is greater than the frequency of the base frequency waveform, the process 1000 then sets a value to a jump factor variable (JUMP_FACTOR) that is proportional to the command signal frequency in block 1018. The process 1000 may determine the value of the jump factor variable as the quotient of a value of the command frequency variable divided by a value representing the resolution of the lookup table (TABLE_RESOLUTION). The resolution of the lookup table determines the size of the lookup table. For instance, for a switching inverter system with a PWM carrier frequency of 10 kHz and a resolution of +/−1 Hz, the size of the lookup table would be 10000 table data points. The same system with a resolution of +/−10 Hz would need a lookup table of only 1000 data points. In any case, the size of the table for a system of N phases may be a multiple of N so as to maintain clear phase separation.

For each of the N phases, the process 1000 then performs the following operations denoted within block 1022 and described further below.

The process 1000 first progresses the value of the phase index variables by incrementing the value of the corresponding phase index variable by the value of the jump factor variable to establish a new value of corresponding phase index variable in block 1026.

Optionally, the process 1000 then handles index round tripping by modifying the value of the corresponding phase index variable to a value corresponding to the mod function of the value of the phase index variable divided by the value of the table size in block 1030. This operation 1030 increments changes in the value of the command signal frequency more smoothly.

The process 1000 then determines the correct "commutation vector", that is, whether the PWM signal is on or off, by selecting the stored value of a PWM raw value variable (PWM_RAW_VALUE) in the lookup table that corresponds to the determined value of the phase index variable in block 1034.

The process 1000 then performs additional post process operations, such as V/Hz modulation, pulse deletion, and so forth, as desired in block 1038.

After the process 1000 completes the aforementioned operations or blocks, it loads the post-processed values of the PWM variables into PWM comparators for the switching inverter to produce the desired polyphase PWM output with N phases in block 1042.

The embodiment of FIG. 1 is suitable for open loop operation of a motor by the switching inverter. However, in practice there will always be a lag between the waveform of the command signal and the position of a rotor for the motor, due to slip loss, magnetic loss, mechanical friction loss, etc.

Figure 2:
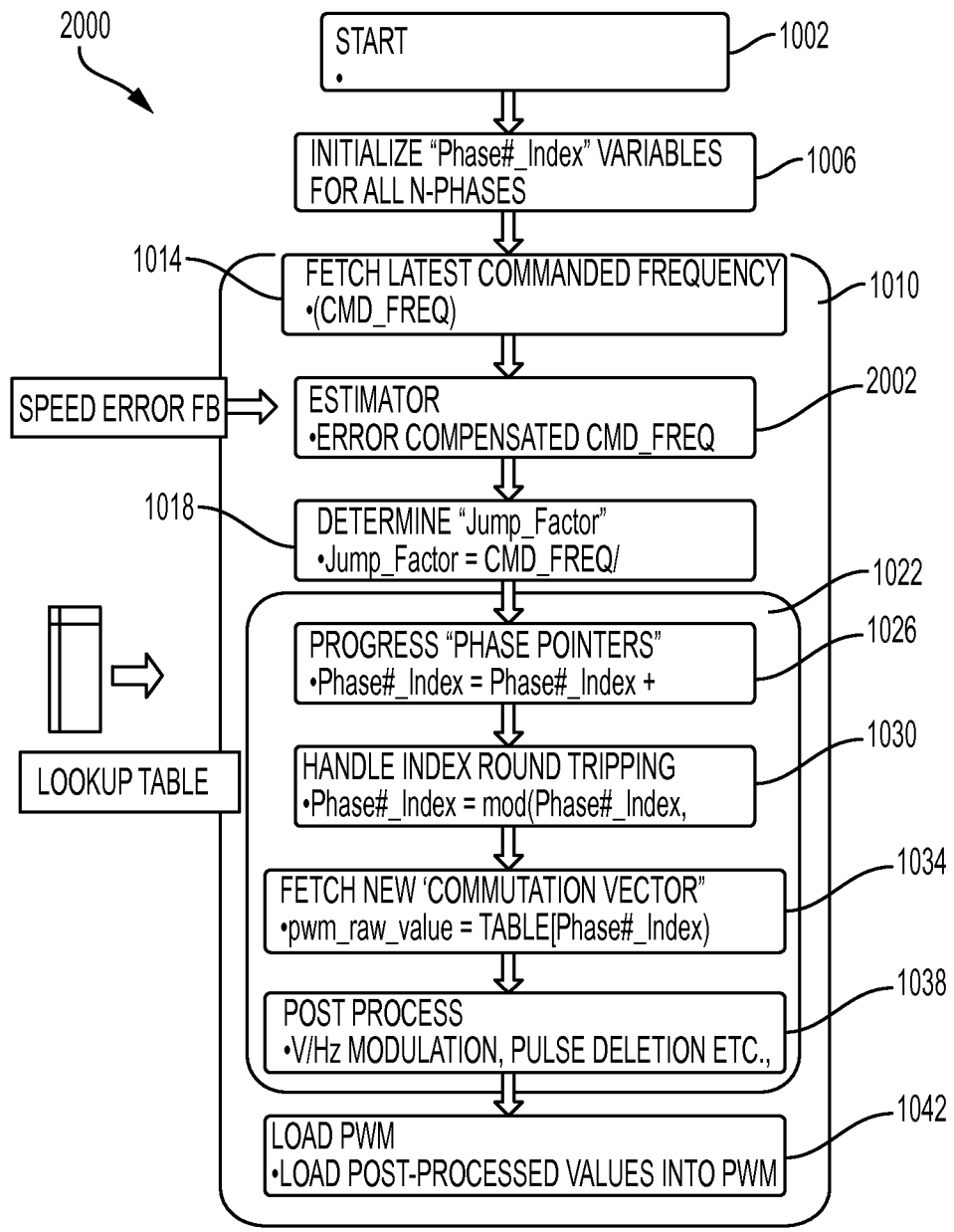
FIG. 2 is a flow chart of a pulse width modulation process according to a second embodiment.

FIG. 2 is a flow chart of a pulse width modulation process 2000 according to a second embodiment that incorporates a first type of error estimation (block 2002) into the process 2000. The process 2000 is similar to the process 1000, so a complete re-description is omitted for the sake of brevity.

In the process 2000 of FIG. 2, motor states (rotor position, speed, phase currents) are estimated by optimally reconstructing the motor states using the actual inputs (PWM sequence) and possibly any measured quantities from the motor itself.

The process 2000 uses the estimated motor states to derive state errors (position, speed, current) that it uses to modify the command frequency variable (CMD_FREQ) according to calculated error feedback information. The process 2000 then uses the modified value of the command frequency variable to determine the value of the jump factor variable. The process 2000 may receive the speed error feedback (FB) information directly using a speed or position sensor or by using a speed error estimation circuit that predicts speed error as a function of the value of the command frequency variable. The insertion of this speed estimator operation 2002 into the process 2000 optimizes the resultant waveform output of the switching inverter.

Figure 3:
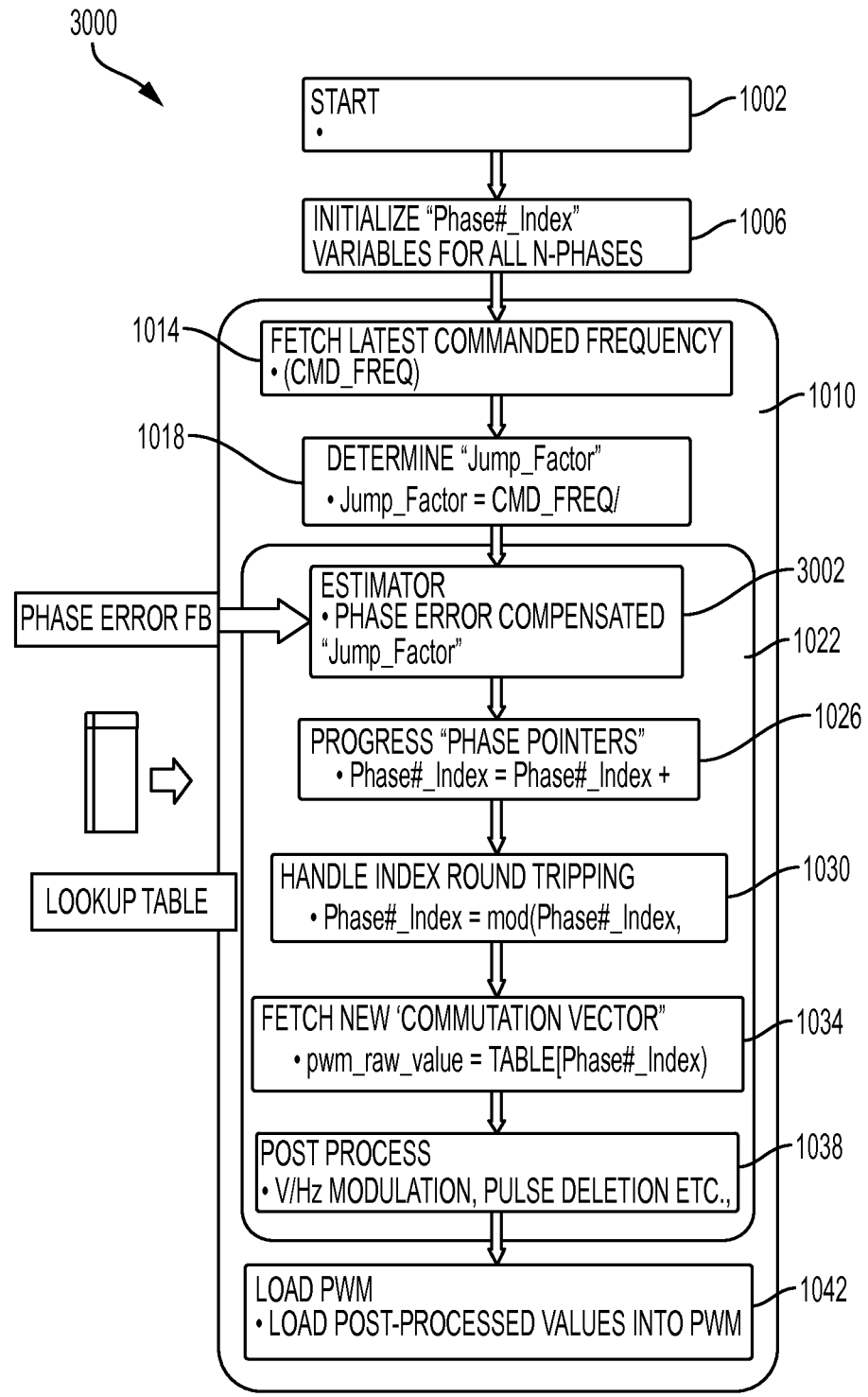
FIG. 3 is a flow chart of a pulse width modulation process according to a third embodiment.

FIG. 3 is a flow chart of a pulse width modulation process 3000 according to a third embodiment that incorporates a second type of error estimation (block 3002) into the process 3000. The process 3000 is similar to the process 2000, so a complete re-description is omitted for the sake of brevity.

The process 3000 estimates phase error in block 3002 and modifies the determined value of the jump factor variable for each of N phases according to phase error feedback (FB) information. The process 3000 may receive the phase error feedback information using reconstructing motor phase errors based on the actual inputs (PWM sequence) and measured quantities from the motor. Such quantities may be obtained from one or more sources, such as a position sensor. As with the case of the second embodiment described above in conjunction with the process 2000, the insertion of this phase estimator operation 3002 into the process 3000 optimizes the resultant waveform output of the switching inverter per motor phase.

Figure 4:
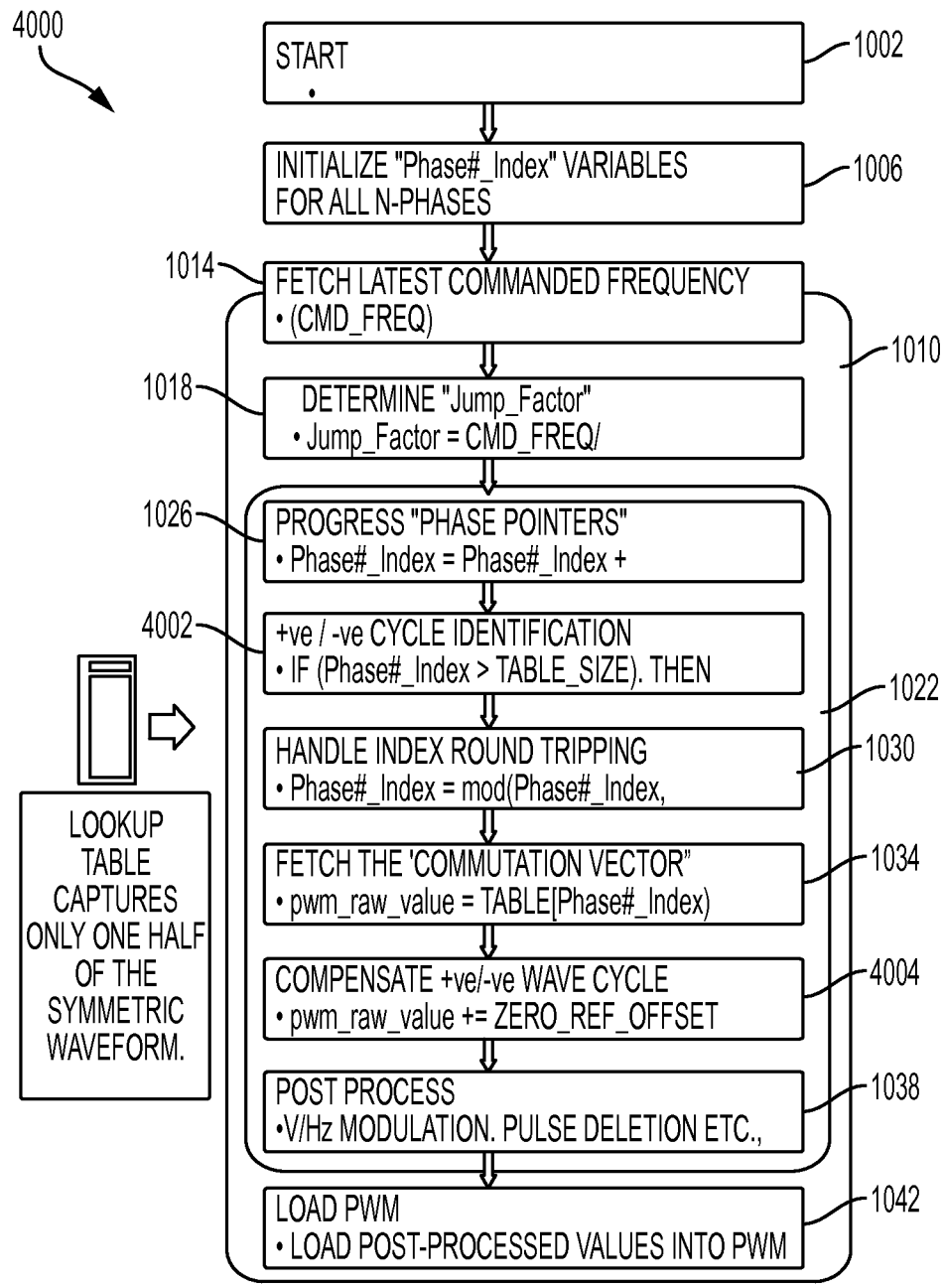
FIG. 4 is a flow chart of a pulse width modulation process according to a fourth embodiment.

If the desired waveform from the switching inverter is symmetric, it is possible to modify one or more of the processes 1000, 2000, and 3000 to reduce the size of the lookup table by one half. As an example, FIG. 4 is a flow chart of a pulse width modulation process 4000 according to a fourth embodiment that keeps track of positive and negative symmetric cycles of the PWM waveform to reduce the size of the lookup table. The process 4000 is similar to the process 1000, so a complete re-description is omitted for the sake of brevity.

The process 4000 responds to a boolean flag that changes state between the positive and negative cycles. After the operation of progressing the value of the phase pointer variables (block 1026), the process 4000 uses the boolean flag to produce positive and negative cycle identification (+ve /−ve) in block 4002. Then, after the process 4000 completes the operation of determining the correct "commutation vector" (block 1034), the process 4000 compensates the commutation vector with the correct positive or negative wave cycle according to the boolean flag identification in block 4004.

Technical effects and benefits of this disclosure include the simplicity of implementation on a fixed or floating point processor, using a simple table indexing scheme that employs a "Jump Factor" for commanding and driving motor speed. This eliminates the need for floating point, trigonometric and complex math calculations, thereby decreasing processor load and application cost. By virtue of the simplicity it is optimized for fixed point implementation in regards to program memory and computational speed. Some embodiments may incorporate a linear/non-linear estimator that estimates the phasing error in the indexing scheme and hence optimize starting and operating torque generation for accurate motor positioning and speed profile following. Some embodiments may incorporate hardware, such as an ASIC or an FPGA.

As described herein, in some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments may be implemented using one or more technologies. In some embodiments, an apparatus or system may include one or more processors, and memory storing instructions that, when executed by the one or more processors, cause the apparatus or system to perform one or more methodological acts as described herein. Various mechanical components known to those of skill in the art may be used in some embodiments.

Embodiments may be implemented as one or more apparatuses, systems, and/or methods. In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein.

Aspects of the disclosure have been described in terms of illustrative embodiments thereof. Numerous other embodiments, modifications and variations within the scope and spirit of the appended claims will occur to persons of ordinary skill in the art from a review of this disclosure. For example, one of ordinary skill in the art will appreciate that the steps described in conjunction with the illustrative figures may be performed in other than the recited order, and that one or more steps illustrated may be optional.

The described embodiments as set forth herein represent only some illustrative implementations of the invention as set forth in the attached claims. Changes and substitutions of various details and arrangement thereof are within the scope of the claimed invention.

What is claimed is:

1. A method of generating a pulse width modulation (PWM) signal, comprising:
    initializing at least one first variable of a first set of variables to an initial value;
    establishing, with a hardware processor, a set of values in a lookup table that correspond to data points for PWM comparator values that correspond to a given number of samples of a single periodic waveform at a predetermined sampling rate that establishes a table resolution;
    repeatedly executing the following operations at the predetermined sampling rate:
        determining a value of a command signal frequency;
        setting a value of a second variable of a second set of variables equal to the quotient of the value of the command signal frequency divided by the table resolution;
        progressing the value of the first variable by the value of the second variable; and
        selecting a value of a commutation vector from the lookup table that corresponds to the first variable;
    loading the PWM variables into a PWM comparator; and
    generating a PWM signal based on the commutation vector from the lookup table.

2. The method of claim 1, wherein the PWM signal has N phases, and wherein the initializing of the at least one first variable to an initial value comprises: initializing a number N of the first set of variables to N values.

3. The method of claim 2, further comprising:
    performing post-process operations on the commutation vectors.

4. The method of claim 3, further comprising:
    compensating the determined value of the command signal frequency with speed error feedback.

5. The method of claim 3, further comprising:
    compensating the value of the second variable with phase error feedback.

6. The method of claim 3, further comprising:
    identifying positive and negative cycle information from a boolean flag that changes state between positive and negative cycles after the progressing of the value of the second variable; and
    compensating the commutation vector with a correct positive or negative wave cycle according to the boolean flag identification after the selecting of the value of the commutation vector.

7. The method of claim 2, wherein the initializing of the at least one first variable to an initial value comprises initializing a number N of the first set of variables to N values.

8. The method of claim 7, further comprising progressing the value of the first variable, selecting the value of the commutation vector, and loading the value of the commutation vector for each of the N phases with their corresponding variables of the first set of variables.

* * * * *